United States Patent [19]
Lernout

[11] Patent Number: 4,843,391
[45] Date of Patent: Jun. 27, 1989

[54] SYSTEM FOR ANALOG-DIGITAL-ANALOG CONVERSION

[76] Inventor: George O. Lernout, 320 Campus Parkway, Chatham, Ontario N7L 5A8, Canada

[21] Appl. No.: 83,277

[22] Filed: Aug. 10, 1987

[30] Foreign Application Priority Data

Aug. 11, 1986 [GB] United Kingdom ............... 8619500

[51] Int. Cl.[4] ........................................... H03M 3/02
[52] U.S. Cl. ................... 341/143; 341/110; 341/77; 341/76; 341/73; 341/63; 375/28; 375/30
[58] Field of Search ............... 340/347 DD, 347 AD; 375/28, 30; 341/143, 110, 63, 76, 73, 77

[56] References Cited

U.S. PATENT DOCUMENTS

3,727,005  4/1973  Franaszer ........................... 375/30
3,763,433 10/1973  Nicholas ..................... 340/347 DD
3,806,806  4/1974  Brolin ................................. 375/30

Primary Examiner—William M. Shoop, Jr.
Assistant Examiner—Gary Romano
Attorney, Agent, or Firm—Anthony Asquith & Co.

[57] ABSTRACT

The invention is applicable to delta modulation. A method of codifying the bit-stream for more efficient storage and transmission is disclosed. The number of pulses from the a-to-d converter is counted, per batch of B clock beats. The count, or tally value T of the batch, may be issued as an N-bit group, e.g. a 4-bit nibble. The order and spacing of the pulses within the batch is ignored. When the signal is rebuilt, a batch of B clock beats are counted out, T of which are pulses. One value which the nibble can take is reserved and used to indicate a period of silence, by replacing a whole frame of silent nibbles. Both a fixed frame length and a variable frame length are disclosed. For greater sensitivity, the extreme tally values may be utilized to signal a change in the gain or response of the system. A median tally value may be used to cancel the gain change.

6 Claims, 6 Drawing Sheets

DEMODULATOR  *FIG 4*

R1 = R2
C1 = C2

MODULATOR  *FIG 3*

SYSTEM FOR ANALOG-DIGITAL-ANALOG CONVERSION

This invention relates to a system for converting a variable-voltage signal into digital form, and vice versa.

The variable-voltage signal may be, for example, derived from a microphone. It is well known to modulate or digitise speech using delta-modulation, in which a rate of generation of pulses depends on the speed with which the speech signal—i.e. the voltage—is changing. A high pulse-rate signifies a rapidly rising voltage, and a low pulse rate signifies a rapidly falling voltage. An intermediate pulse-rate signifies an unchanging voltage, or silence. The pulses produced by the delta-modulation are encoded in one of the many ways that are presently available.

In the invention, it is recognised that the number of digital bits required to store and transmit the pulses produced by delta-modulation can be reduced, without the corresponding reduction in the quality and intelligibility of the speech that would be expected.

As the invention is applied to a conventional delta-modulation system, a batch B of clock beats are counted out, and a tally is kept of the number of pulses present in that batch of beats. The number of pulses in the batch, termed the tally value T, is codified in digital form, the number of bits N needed to transmit the tally value being much less than the number B of beats in the batch. The tally value may be stored or transmitted as a four-bit digital value, or nibble.

A 4-bit nibble may take 16 different forms (from 0000 to 1111). Thus a 4-bit nibble can distinguish 16 different tally values, i.e. 16 different numbers of pulses in the batch. The number of beats B in the batch therefore should be no more than 16.

It is a feature of the invention that no account is taken of the order in which the pulses appear in the batch. Thus in a batch for which B is 15 beats, if for example 5 of the beats are pulses, the tally value T of that batch will be 5, irrespective of whether the 5 pulses were the first 5 beats of the batch, or the last 5, or were regularly spaced over the batch.

In the invention, the tally value T is used during demodulation to rebuild the stream of pulses, which in turn is used to rebuild the analogue or voltage signal. Thus if a nibble is received which has a tally value of, say, 4, the demodulator would generate a batch B of beats of which 4 are pulses. As mentioned above, the order of the pulses within the batch has been lost, but it is recognised in the invention that, though this leads to a small loss of fidelity, the resulting savings in the number of bits required to store and transmit the signal can be enormous.

Other ways have previously been proposed for reducing the bit-rate while still maintaining good speech fidelity: it has been found that a very favourable compromise is possible between speech quality and bit-rate, using the tally count system of the invention.

Because the order of the pulses within the batch has been lost, it follows that, when the batches are being regenerated, the pulses must be arranged in the batches in some arbitrary manner. Preferably, the pulses are spaced regularly and evenly over the batch.

In the invention, the number of beats in a batch generated by the batch generator when rebuilding the signal should be the same as the number B of beats in the original batch of beats. It is preferred to do this simply by pre-setting the batch number, which then remains unchanged. It is however contemplated in the invention that the batch number might change, either according to a preset formula, or according to signals contained in the tally values.

In the invention, it is preferred that one of the tally values be reserved for the purpose of signifying a period of silence, particularly in the case where the signal is speech. Thus, just a single value could be used to replace a long string of tally values during a period of silence.

In the invention, when the tally value is a nibble, one of the sixteen possible states that a nibble can take is reserved for the purpose of signifyig the long string of tally values.

When a string or frame of tally values is replaced with just one value, as is preferred in the invention, the signal may be rebuilt after transmission by replacing the single (reserved) value with the correct number of tally values, each signifying silence. One benefit of this is that the period of silence is introduced just as the signal is being rebuilt, so that the rebuilt silence can be an absolute silence, virtually entirely without noise.

Equally, the "silence" that is detected as such for storage and transmission need not have been absolute silence to be recognised as silence. But when the signal is rebuilt, this near-silence can be replaced with absolute silence. A signal treated in this way can have a very low noise content, without the need for filters or other measures that would add to the complexity and expense.

The invention may be used with bit-groups of length other than nibbles of four bits. However, 4-bit nibbles have been found to be convenient, especially so when the nibbles are arranged in pairs to constitute 8-bit bytes, since bytes can be readily processed by simple computer technology.

It may be noted that herein the terms "beat" and "pulse" should not be construed narrowly. Physically, in a digital system, the beat may be produced and sensed as a predetermined period of time over which the voltage level is at either a high level (1) or a low level (0), or the beats may be produced and sensed as periodic changes of voltage, either from the high level to the low level (0), or from the low level to the high level (1). Thus there are two kinds or levels of beats. "Pulses" in this context are beats of one of the levels, usually the (1) level.

To illustrate how the principles of the invention can be incorporated into an actual converter, an embodiment of the invention will now be described, with reference to the accompanying drawings, in which.

Figure 1:
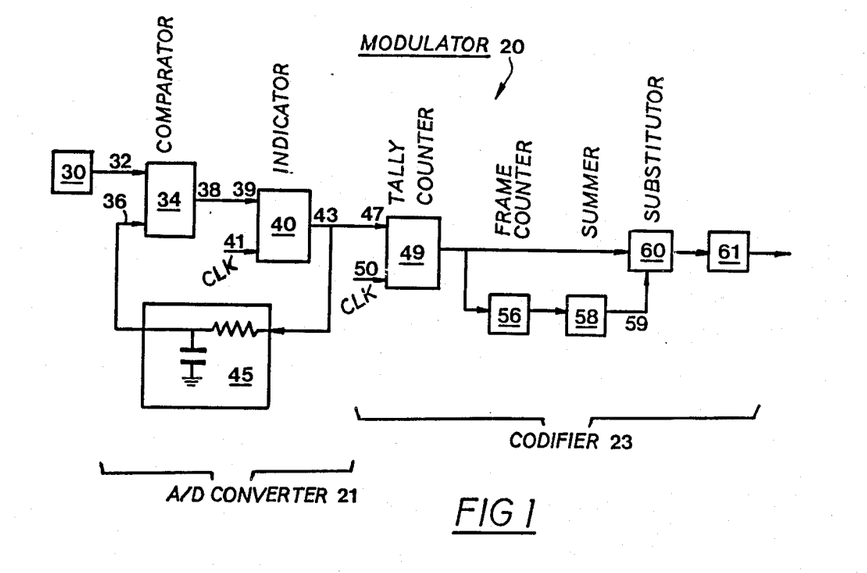
FIG. 1 is a diagram showing a modulator which includes an analogue-to-digital converter, and which embodies the invention.

The modulator 20 of FIG. 1 includes an analogue-to-digital converter 21, for digitising the analogue signal, and a codifier 23 for processing the digitised signal. Speech is received through a microphone 30, which converts the speech into a varying voltage. This voltage is fed to one input 32 of a comparator 34. The comparator 34 is so arranged that if the voltage at input 32 is higher than the voltage at the other input 36, the output 38 of the comparator 34 has a HIGH voltage: if the voltage at the input 32 is lower than the voltage at the input 36, then the output 38 takes on a LOW voltage.

The HIGH or LOW voltage at the output 38 of the comparator is fed to the input 39 of an indicator 40. The indicator 40 is also fed, at 41, with regular periodic beats, in the form of voltage pulses, by a clock.

The clock beats or pulses fed to the indicator 40 are reproduced at the output 43 of the indicator if the input 39 had, when the beat was received, a HIGH voltage, but the beats or pulses that were fed to the indicator at a time when the input 39 was LOW are not reproduced at the output 43 of the indicator 40 (or, in other words, they are reproduced as non-pulses).

The indication signal at the output 43 of the indicator 40 thus is a continuing series of pulses at the clock beat frequency if the voltage at 32 is larger than the voltage at 36, and the signal at the output 43 is zero, i.e. non-pulses, if the voltage at 36 is larger than the voltage at 32. It may be noted that in practice generally the duration of pulse would be equal to the whole period of the clock beat, i.e. the pulse would be as long as one mark plus one space of the clock beats. Thus, pulses produced at consecutive clock-beats would merge together without a break.

The voltage at 36 is a reference voltage derived from an integrator 45. The voltage at 36 produced by the integrator 45 corresponds to the proportion of pulses to non-pulses at the output 43. The greater the proportion of pulses to non-pulses, the higher the voltage.

If the voltage at 32 happens to be rising as a result of speech at the microphone 30, the input 32 will be higher than the input 36. Therefore, 38 will be HIGH, and consequently pulses will be produced at 43. The voltage at 36 from integrator 45 starts to rise if there are pulses at 43. The voltage at 36 therefore tends to follow a rise, if a rise occurs, in the voltage at 32.

Similarly, the voltage at 36 will start to fall following a fall in the voltage at 32.

If the voltage at 32 is not varying, i.e. if there is silence, the two voltages at 32 and 36 will be equal. It may be noted that for silence—i.e. for equality of the voltages at 32 and 36—the number of pulses at 43 will equal the number of non-pulses.

During silence, the voltage at 36 in fact does not settle to a steady value, equal in magnitude to the voltage at 32. Instead, the voltage at 36 fluctuates first higher than the voltage at 32 and then lower. Since this ripple is at clock-beat frequency, however, the ripple can be ignored; and it can be taken that the voltage at 36 equals the voltage at 32 during silence.

The stream of pulses from the indicator 40 is fed to the input 47 of a tally counter 49. The tally counter 49 counts out a predetermined number, or batch, of clock pulses B received at the clock input 50 of the tally counter 49, and the tally counter also counts the number of pulses received at the input 47 for that given number or batch of clock pulses.

The quantity of pulses received at the input 47, for a particular batch of clock pulses, is termed the tally value T of that batch. The tally counter 49 issues the tally value of the batch to the ouput 52 of the tally counter 49 as a digital number, i.e. as a sequence of bits. It is preferably arranged, in the invention, that the number of clock beats in a batch is fourteen; thus the tally value may be any value between zero and fourteen.

There are enough bits in a four-bit nibble to transmit all the (decimal) numbers to fifteen (including zero). So, if the tally value is transmitted as a 4-bit nibble, and if the tally value can be from zero to fourteen, there is one possible value of the four-bit nibble that is not required.

In the invention, this "spare" tally value is reserved and used to indicate a period of silence, in the manner which will now be described.

The stream of tally values—i.e. the stream of nibbles—coming from the output 52 of the tally counter 49 is fed to input 54 of a frame counter 56. The frame counter 56 keeps a count of the number of tally values (i.e. the number of four-bit nibbles) received from the tally counter 49. The nibbles are lumped into frames of nibbles, and, in the invention, the number of nibbles in a frame is preferably around thirty.

As mentioned above, "silence" at the microphone 30 produces an equal number of pulses as non-pulses at 43, and so "silence" produces a tally value of 7 on the 0 to 14 scale of pulses received per batch of clock pulses.

The stream of tally values passing from the tally counter 49 enters a substitution means 60. Normaly, the tally values pass straight through the substitution means 60, but if the deviation signal at 59 is present, the substitution means acts to cancel all thirty "silent" tally values making up the frame and acts to replace the thirty with the reserved nibble value. This silence-nibble then takes its place in sequence with the rest of the tally value nibbles being fed to the output 61 of the modulator 20.

Thus, in the invention, a period of silence which lasts for a whole frame of tally value nibbles is transmitted from the output as just one nibble.

It is preferably arranged in the invention that the deviation signal need not be quite zero for the deviation summer 58 to issue a deviation signal. It is recognized that "almost-silence" can be detected not as zero but as a small marginal value of the deviation signal, which can be classed as silence for the purposes of the invention. It has been found, in the invention, that for a frame of thirty nibbles the margin on the value of the deviation signal, which can be classed as silence, can be around fifteen or sixteen.

From the output 61 the stream of nibbles—i.e. the stream of tallyv alues—can be passed into a computer or other digital-information handling device. The stream may be converted back into speech using a demodulator.

Figure 2:
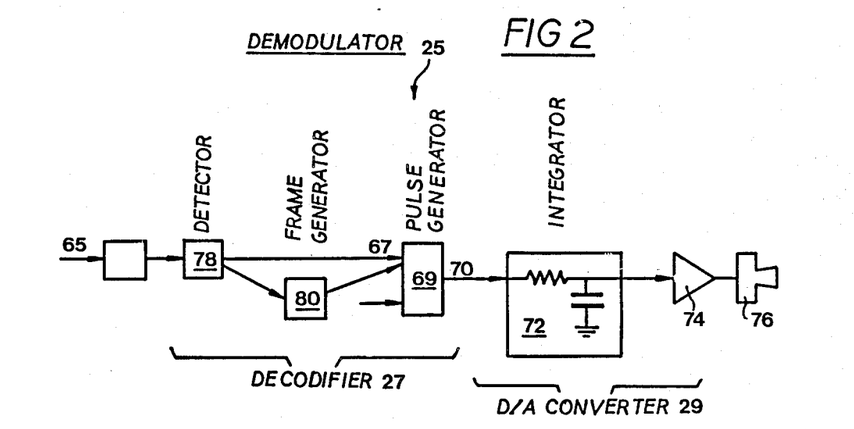
FIG. 2 is a diagram showing a demodulator which includes a corresponding digital-to-analogue converter.
Figure 3:
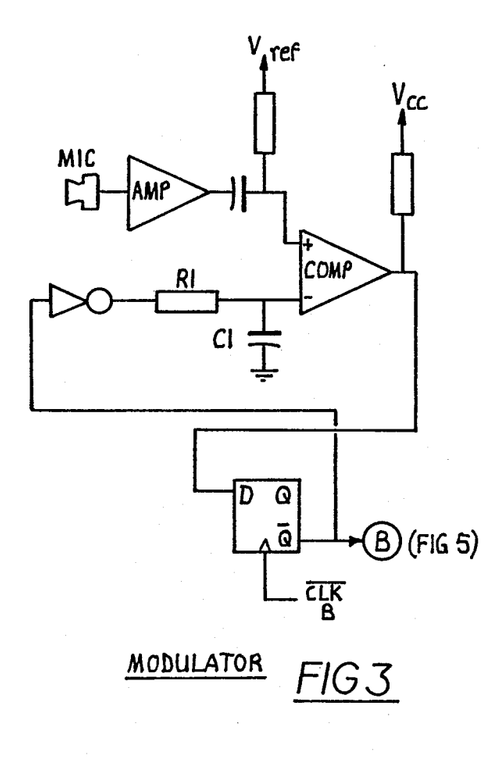
FIG. 3 is a detail of the a-to-d converter of FIG. 1.
Figure 4:
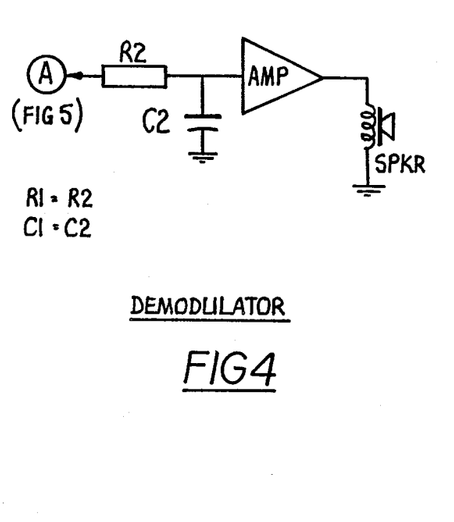
FIG. 4 is a detail of the d-to-a converter of FIG. 2.

FIG. 2 shows a demodulator 25, which includes a de-codifier 27, and a digital-to-analogue converter 29 to convert the signal back into speech. The stream of tally nibbles enters at 65 and passes to theinput 67 of a pulse-generator 69. The pulse-generator 69 also receives a clock input. The pulse-generator 69 counts out a batch of fourteen clock beats for each nibble received at 67, and issues the appropriate proportion of pulses to non-pulses into the output 70, the proportion being determined by the value of the tally nibble received at 67.

The output 70 from the pulse-generator 69 passes to a pulse-to-voltage integrator 72, which creates a signal voltage to be fed to an amplifier 74 and speaker 76. The integrator 72 is similar to the integrator 45, in that the voltage at 74 rises if the proportion of pulses to non-pulses if high, and the voltage falls if the proportion of pulses to non-pulses is low. If the batch of fourteen clock beats at 70 contains pulses and non-pulses in equal quantities, the voltage at 74 will not change, (apart from the insignificant ripple at the clock-beat frequency) and therefore there will be sound produced.

Before passing to the pulse-generator 69, the stream of tally nibbles in 65 passes first to a detector 78. The detector is set to detect whether the tally value is equal to the reserved tally value which has been used to indicate silence. If this tally value is detected, the value is not passed to the pulse-generator 69, but instead the framegenerator 80 is activated.

The frame-generator 80, when actuated, generates a frame of tally values, all of which have the value 7, corresponding to silence. The number of tally values in the frame is thirty, to correspond with the frame-length referred to previously. The thirty tally nibbles of tally value 7 are inserted into the stream of nibbles entering the pulse-generator 69.

In the invention, the frame-length i.e. thirty nibbles, may be set to correspond to about 3 milliseconds of speech. It is recognised, when the frames are that length that, if one frame is detected as carrying a speech signal, but if that frame is sandwiched between two frames that are detected as being silent, then the one frame can be also classed as silence. It is recognised that bursts of sound lasting three milliseconds or less, if sandwiched between periods of silence lasting three milliseconds or more, are more likely to have been caused by noise than by actual speech.

The reduction in noise that results from substituting such sandwiched frames with silence enhances the quality of the resulting generated speech. Also, transmitting the whole frame of nibbles by the single nibble that represents a silent frame, allows intelligible speech to be sent at a slower bit-transmission rate.

The pulse- generator may be set, in the invention, to build up the sequence of fourteen pulses/non-pulses in such a way as to space the pulses apart evenly. This leads to the voltage changes, as fed to the amplifier, being smooth and even.

Figure 5:
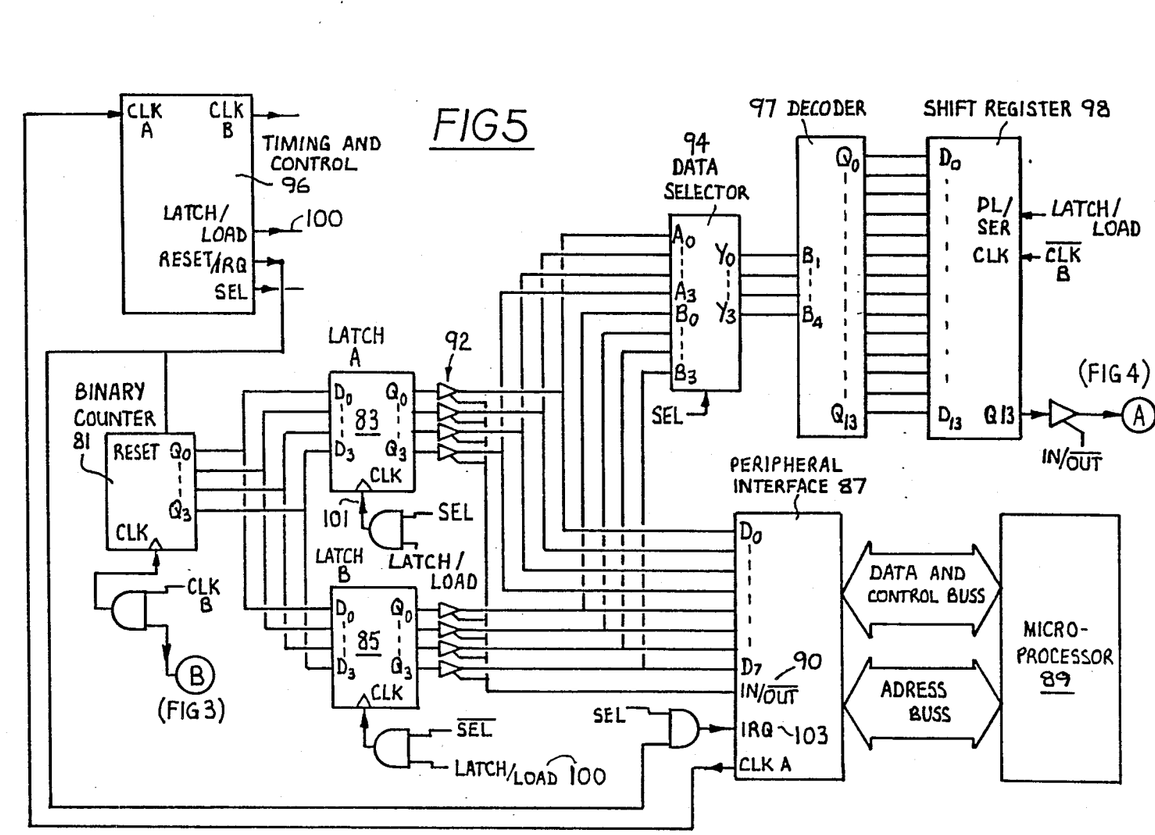
FIGS. 5 and 6 show further converter details.
Figure 6:
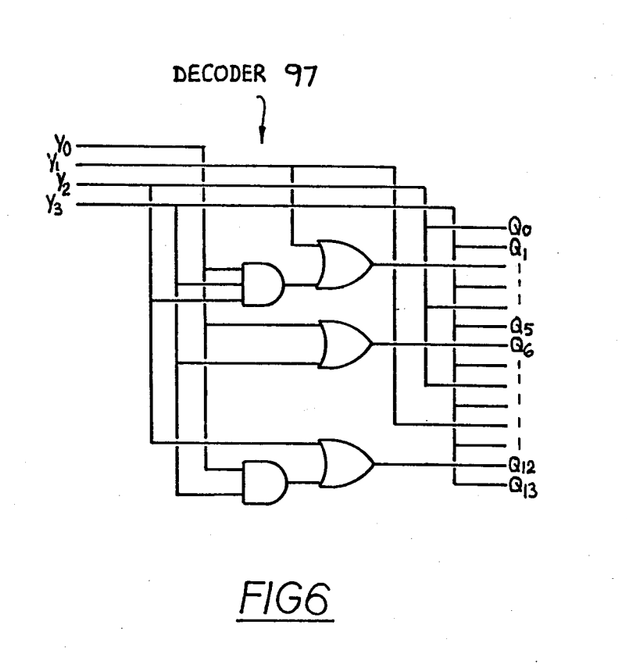
Figure 7:
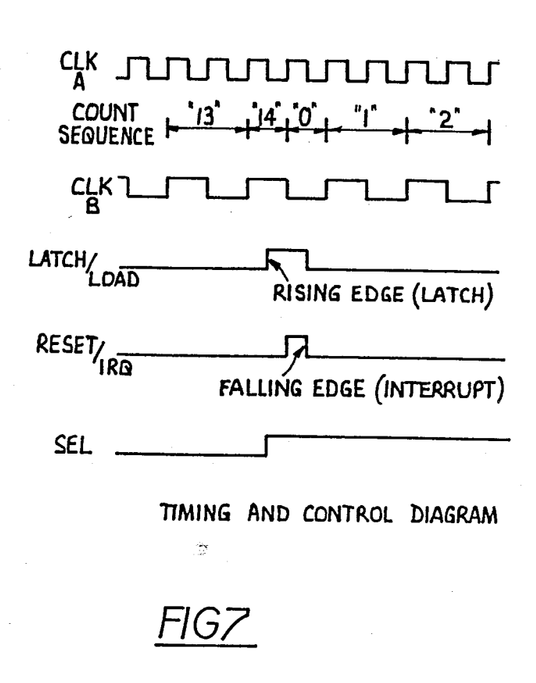
FIG. 7 is a timing and control diagram.

The encoding and decoding functions indicated generally in FIGS. 1 and 2 are shown in more detail in the other Figures. In FIG. 5, there is shown a hardware set-up whereby the 4-bit nibbles that constitute the tally values are processed into eight-bit bytes, which are generally more efficient to handle.

The binary counter 81 counts the number of "1"s in a 15-beat batch received into the tally counter 49. The counter 81 issues the tally value as a 4-bit nibble, which is latched into a first latch 83. The next tally nibble is read into the second latch 85. The data is fed into the peripheral interface 87 and stored in the computer 89 as an eight-bit byte. On output, the in/out pin 90 is set low, disabling the 3-state buffers 92 on the latches 83,85, so that pins D0 through D7 on the peripheral interface 87 become outputs. The data selector 94, controlled from the timing and control unit 96, routes the two nibbles that make up the byte, in sequence to the decoder 97 and the shift register 99.

The hardware for this converter can be reduced by eliminating the second latch 85 and by applying the latch/load strobe 100 directly to the clock 101 of the first latch 83, and by applying the RESET/IRQ strobe directly to the Interrupt Request (IRQ) pin 103 of the computer 89. The data selector 94 can be eliminated and the outputs D0 through D3 connected directly to the decoder 97. This hardware reduction would however result in the nibbles being processed more slowly by the computer.

Alternatively, the encoding and decoding can be done by software methods.

Indexed addressing and look-up tables can be used to speed up the encoding and decoding algorithms.

The bit counting operations described are interrupt-driven. This allows the computer to work on other programs while the speech is being processed.

The invention allows many variations of data format, and in the coding operations. For example, the pulse counter could be changed to count out any number of clock periods, in place of fourteen, and the the tally values may then be transmitted by some number of bits other than a nibble of four bits.

For speech, the clock beats should be at a frequency of 70 to 140 kHz.

In the system described above, the frame of batches has been of a fixed length, for example 30 batches in a frame. All that need be done when the frame length remains constant is simply to set the frame generator 80 to generate the present number of nibbles.

A further refinement of the system is to provide a variable frame length. However, when the frame length is not predetermined and fixed, some manner has to be incorporated into the system for indicating to the frame generator in the demodulator how many nibbles to put into the frame. Such a manner will now be described.

Figure 8:
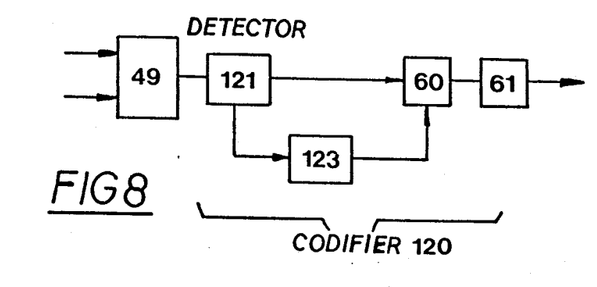
FIG. 8 is a detail of a modified modulator.

The variable-frame length option may be incorporated into the kind of system describd above. In FIG. 8, the modulator includes a codifier 120. The tally value of each nibble in the bit-stream is read by a detector 121, and the difference or margin between the as-read tally value and the tally value (7) for silence, is measured. If the tally value is not within the predetermined margin of silence, the nibble passes through to the output 61. If the tally value of the nibble is within the margin, a count is started and kept in the counter 123, of the number of nibbles in succession (ie the frame F) for which the tally values are within the predetermined margin. These nibbles are not passed to the output 61. When a non-silent nibble is next encountered at the detector 123, the frame count is terminated. The substitutor 60 then inserts the reserved tally value into the bitstream sent to the output. It is arranged that the substitutor also inserts a special tally value into the bitstream, immediately following the spare tally value, which corresponds to the counted number of nibbles in the frame.

In the demodulator, the reserved tally value is then used as before (FIG. 2) to indicate to the frame generator 80 that a frame of silent nibbles is to be generated. The de-codifier 27 is also programmed to read the next nibble following the reserved nibble for the information as to how many nibbles the generated frame is to contain. The nibble following the reserved-value nibble, by virtue of its sequence, is therefore read not as a tally value but as a frame length indicator.

Preferably, it is arranged that an occasional isolated "silent" nibble would go through as an ordinary nibble, and would not be treated as a frame. In fact, the minimum number in succession of silent nibble that should be treated as a frame is preferably about three.

In the codifier 120, the margin by which the tally values can deviate from the value for true silence (7) and still be recognised as silence, can be small, or even zero. It is recognised that the variable frame length option allows the silence to be detected more sensitivity, without unduly increasing the bit-rate.

In another option of the invention, a gain-control facility may be incorporated into the system. The operation of the facility may be explained as follows.

A 4-bit nibble can only take 16 different states, and in the delta-modulation system, the 16 states represent 16 different rates of change of the voltage of the analogue signal. The gain of the delta-modulation system must be set so that the rates of change of voltage that are experienced in practice correspond, substantially evenly, to the 16 states, and so that the extreme states correspond to such rapid swings of voltage as are only rarely encountered. (If one of the sixteen values is the reserved value which will be used to indicate silence, as is preferred in the invention, then of course only fifteen different rates of change of the voltge can be distinguished.)

For greater sensitivity, it would be desirable for the gain of the system to be variable: when the sound is loud, the gain should be low, and when the sound is soft, the gain sould be high. However, when the gain is variable, it becomes necessary to indicate to the digital-to-analogue part of the system that the change of gain has taken place.

In the variable-gain option of the invention, this may be done in the following manner.

A gain change controller 126 is included in the modulator 127 (FIG. 9), and may be incorporated into the integrator 45 as shown.

Figure 9:
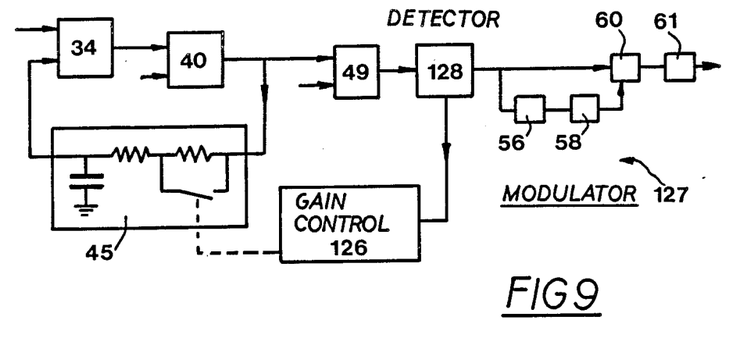
FIG. 9 is a detail of another modified modulator.

The tally value of each nibble is read by the detector 128. If the tally value is extreme (i.e. if the tally value is 0 or 14) then the controller 126 is triggered to increase the gain of the converter. The converter then remains at the higher gain until a tally value representing silence (7) is detected, upon which the controller is triggered back to the normal gain.

The same thing takes place in the demodulator (FIG. 10) which also includes a gain change controller 129. When an extreme tally value is detected, the controller 129 activates the gain-change, and when the silence value is detected, the controller cancels the gain-change.

Figure 10:
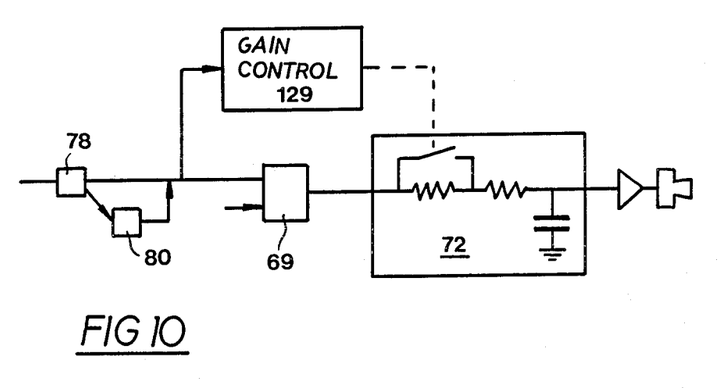
FIG. 10 is a detail of a modified demodulator, which corresponds to the modulator of FIG. 9.

In the invention, the gain-change controllers 126,129 may be set to be activated upon detecting just the extreme values, or upon detecting also the marginal almost-extreme values. Similarly, the controllers may be set to be de-activated upon detecting just the silence value itself, or upon detecting also the marginal almost-silence values.

Where a 4-bit nibble is used to indicate frame length, up to 16 different frame lengths can be communicated. The frame length that is signified by each particular value must be set by pre-programming the frame generator 80.

The invention may be used for the modulation/demodulation of speech, for direct, real-time speech communication, for example in a network system. However, the invention is particularly useful for the purpose of allowing pre-recorded packets of speech to be stored in a computer in digital form. The pre-recorded and digitised speech packets may be duplicated, and marketed either as a hardware or a software package. The package may be arranged to make use of a speech reproduction function built into the computer, or the package may include a separate speech reproduction function.

I claim:

1. in a system comprising an a-to-d means for converting an analogue signal into a corresponding stream of high and low pulses, and a d-to-a means for converting a stream of pulses into a corresponding analogue signal;
a method for modifying the stream of pulses to enhance the transmissibility and storability thereof, which comprises the steps: in a codifying means:
   1. of receiving the stream of pulses from the said a-to-d means;
   2. of counting off a batch number (B) of the pulses in the stream;
   3. of computing how many (herein termed a tally value, T) of the pulses in the batch are of one of the levels;
   4. of generating a group of bits, N bits long, the value of which corresponds to T;
   5. and of outputting successive groups of N bits as a bit-stream;
and, in a de-codifying means:
   1. of receivng the bit-stream;
   2. of counting off a group of N bits in the stream;
   3. of computing the tally value T of that group of N bits;
   4. of generating a batch of B pulses, T of which are of the said first kind;
   5. and of passing the successive batches of B pulses to the d-to-a means;
wherein the numbers B and N of the codifying means correspond to numbers B and N of the de-codifying means;
and wherein the number N is substantially smaller than the number B;
the method further comprising:
a method for effecting a change of gain in the converters, which comprises the steps:
of detecting whether the respective tally value T of the batches of pulses is an extreme value, or is a median value, or is neither;
of providing respective, operable gain-change means, one in each of the two converters, which are effective, when operated to make a predetermined corresponding change in the gains of the two converters;
of operating the two gain-change means in response to the tally value T being an extreme value;
and of de-operating the two gain-change means in response to the tally value T of the batches being a median value.

2. In a system comprising an a-to-d means for converting an analogue signal into a corresponding stream of high and low pulses, and a d-to-a means for converting a stream of pulses into a corresponding analogue signal;
a method for modifying the stream of pulses to enhance the transmissibility and storability thereof, which comprises the steps: in a codifying means:
   1. of receiving the stream of pulses from the said a-to-d means;
   2. of counting off a batch number (B) of the pulses in the stream;
   3. of computing how many (herein termed a tally value, T) of the pulses in the batch are of one of the levels;
   4. of generating a group of bits, N bits along, the value of which corresponds to T;
   5. and of outputting successive groups of N bits as a bit-stream;
and, in a de-codifying means:
   1. of receiving the bit-stream;
   2. of counting off a group of N bits in the stream;

3. of computing the tally value T of that group of N bits;
4. of generating a batch of B pulses, T of which are of the said first kind;
5. and of passing the successive batches of B pulses to the d-to-a means;

wherein the numbers B and N of the codifying means correspond to numbers B and N of the de-codifying means;

and wherein the number N is substantially smaller than number B;

the method further comprising:

a method for further enhancing the storabitlity and the transmissibility of the stream of pulses, when the analogue signal is subject to periods when the signal remains substantially constant, comprising the steps:

of measuring the marginal value by which the respective tally values T of the groups of N bits differs from a predetermined value;

of setting the number of pulses (B) in a batch at no more that (2 to the power N) −2, whereby one of the possible values that a bit-group of N bits can take is not needed as a tally value, herein termed the spare value;

of counting off a number of the groups of N bits, herein termed the frame number (F);

of measuring the sum (M) of the marginal values of the said frame;

of providing an operable frame-substitution means in the codifying means, which is effective, when operated, to cancel the whole frame of F bit-groups of that frame from the bit-stream, and to substitute for those F bit-groups the bit-group having the spare value;

of operating the said frame-substitution means in response to the sum M being no more than a predetermined value;

of providing an operable frame-generation means in the de-codifying means, which is effective when operated, to generate a frame of F bit-groups, each of N bits, the tally value of each group in the generated frame being of a predetermined value;

and of inserting the said generated frame into the bit stream passing to the de-codifying means.

3. Method of claim 2, including, in order to define the number F of tally values that will constitute a frame, the step of pre-setting the number F in both the codifying means and the de-codifying means.

4. Method of claim 2, including, in order to define the number F of tally values that will constitute a frame, the steps:

of computing whether the said marginal value of each bit-group of N bits is no more than a predetermined marginal value;

of setting the frame number F to correspond to the number of bit-groups in succession for which the respective marginal values are no more than the said predetermined marginal value;

of generating a length-indicating bit-group, the value of which corresponds to the frame number F;

of inserting the length-indicating bit-group into the bit-stream, in a predetermined sequence with the bit-group having the said spare value;

in the de-codifying means, of detecting the presence of the spare value, of detecitng the value of the length-indicating bit-group in the predetermined sequence with the spare value, and of generating the frame length F in accordance with the value of the length-indicating bit-group.

5. Method of claim 2, wherein the number F of bit-groups in each of the frames is approximately thirty.

6. Method of claim 4, wherein the said predetermined marginal value appropriate to the frame-substitution means is zero.

* * * * *